(12) United States Patent
Natori

(10) Patent No.: US 11,111,421 B2
(45) Date of Patent: Sep. 7, 2021

(54) THERMAL- AND UV-CURING ADHESIVE COMPOSITION

(71) Applicant: Henkel AG & Co. KGaA, Duesseldorf (DE)

(72) Inventor: Toshiki Natori, Kanagawa (JP)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 16/998,581

(22) Filed: Aug. 20, 2020

(65) Prior Publication Data

US 2020/0377770 A1     Dec. 3, 2020

Related U.S. Application Data

(63) Continuation of application No. PCT/JP2019/005299, filed on Feb. 14, 2019.

(30) Foreign Application Priority Data

Feb. 20, 2018  (JP) .............................. JP2018-028205

(51) Int. Cl.
| | |
|---|---|
| C08F 2/46 | (2006.01) |
| C08F 2/50 | (2006.01) |
| C08G 61/04 | (2006.01) |
| C09J 133/14 | (2006.01) |
| G02B 7/02 | (2021.01) |

(52) U.S. Cl.
CPC ............ C09J 133/14 (2013.01); G02B 7/025 (2013.01)

(58) Field of Classification Search
CPC ........ G03F 7/038; G03F 7/027; G03F 7/0385; C09J 133/14; G02B 7/025
USPC ........... 522/19, 12, 7, 6, 71, 189, 184; 520/1
See application file for complete search history.

(56) References Cited

U.S. PATENT DOCUMENTS

| | | |
|---|---|---|
| 2007/0160370 A1 | 7/2007 | Kikuchi et al. |
| 2009/0061117 A1 | 3/2009 | Oyama et al. |

FOREIGN PATENT DOCUMENTS

| | | | |
|---|---|---|---|
| CN | 1798793 | * | 7/2006 |
| CN | 102812396 | * | 12/2012 |
| JP | 2007184801 | | 7/2007 |
| JP | 2009141406 | | 6/2009 |
| WO | 2017073548 | | 5/2017 |

OTHER PUBLICATIONS

Rogers et al, CN 1798793 Machine Translation, Jul. 5, 2006 (Year: 2006).*
Mizobe et al, CN 102812396 Machine Translation, Dec. 5, 2012 (Year: 2012).*
International Search Report issued in connection with International Patent Application No. PCT/JP2019/005299 dated May 10, 2019.

* cited by examiner

*Primary Examiner* — Jessica Whiteley
(74) *Attorney, Agent, or Firm* — Steven C. Bauman

(57) ABSTRACT

Provided is an adhesive composition that enables, in assembling a camera module, sufficient curing of a site where ultraviolet rays do not reach, while the adhesive is being cured; and that can reduce or prevent a change in the distance between a lens and an image sensor in a heating step, when a lens holder is adhered to a substrate having the image sensor fixed thereon. A thermal- and UV-curing adhesive composition contains (a) an epoxy (meth)acrylate resin; (b) a (meth)acrylic acid ester; (c) a heat-curing agent; and (d) a photopolymerization initiator, wherein the epoxy (meth)acrylate resin (a) contains 20% by weight or more of a (meth)acryloyl group based on the total weight of the resin, and the weight ratio of the epoxy (meth)acrylate resin (a) to the (meth)acrylic acid ester (b) (a)/(b) is from 30/70 to 70/30.

12 Claims, 1 Drawing Sheet

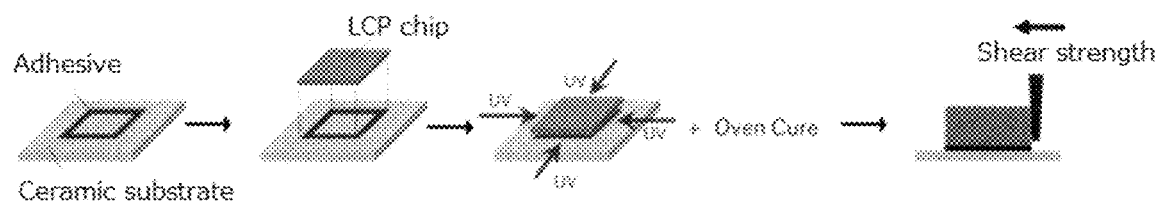

THERMAL- AND UV-CURING ADHESIVE COMPOSITION

TECHNICAL FIELD

The present invention relates to thermal- and UV-curing adhesive compositions.

BACKGROUND ART

A compact camera module that is equipped in, for example, a smartphone, includes a lens, a cylindrical lens holder for holding the lens, and an image sensor that converts the light collected by the lens into an electrical signal and that is fixed on a substrate. In the assembly of such a compact camera module, the lens holder and the substrate having an image sensor fixed thereon must be firmly adhered to each other, and an adhesive is used for adhering them (PTL 1).

To adhere the lens holder to the substrate having an image sensor fixed thereon, the distance between the lens and the image sensor must be accurately maintained. Specifically, the distance between the lens and the light-receiving surface of the image sensor must match the focal point distance of the lens. For this purpose, the use of a UV-curable adhesive is suggested (PTL 2).

CITATION LIST

Patent Literature

PTL 1: JP2007-184801A
PTL 2: JP2009-141406A

SUMMARY OF INVENTION

Technical Problem

The present inventor found that after the lens holder is adhered to the substrate having an image sensor fixed thereon in assembling a camera module, a substrate-heating step may be necessary; and that in such a situation, the use of a traditional adhesive may change the distance between the lens and the image sensor in the heating step.

The present inventor also found that although the use of a UV-curable adhesive can prevent the change in the distance between the lens and the image sensor in the heating step, the use of the UV-curable adhesive may lead to insufficient curing of a site where ultraviolet rays do not reach. In this case, bubbles may develop on the insufficiently cured site, or adhesion cannot be maintained in a harsh environment.

An object of the present invention is to provide an adhesive composition that enables sufficient curing of a site where ultraviolet rays do not reach while the adhesive composition is being cured; and that can reduce or prevent a change in the distance between the lens and the image sensor in the heating step, when the lens holder is adhered to the substrate having the image sensor fixed thereon to assemble a camera module.

Solution to Problem

The present inventor conducted extensive research to achieve the object, and found that the present object is achieved by the use of a thermal- and UV-curing adhesive composition comprising (a) an epoxy (meth)acrylate resin; (b) a (meth)acrylic acid ester; (c) a heat-curing agent; and (d) a photopolymerization initiator, wherein the epoxy (meth)acrylate resin (a) comprises 20% by weight or more of a (meth)acryloyl group based on the total weight of the resin, and the weight ratio of the epoxy (meth)acrylate resin (a) to the (meth)acrylic acid ester (b) ((a)/(b)) is from 30/70 to 70/30. The present invention was completed by conducting further research based on this finding, and includes the following subject matter.

Item 1.
A thermal- and UV-curing adhesive composition, comprising:
(a) an epoxy (meth)acrylate resin;
(b) a (meth)acrylic acid ester;
(c) a heat-curing agent; and
(d) a photopolymerization initiator,
wherein the epoxy (meth)acrylate resin (a) comprises 20% by weight or more of a (meth)acryloyl group based on the total weight of the resin, and the weight ratio of the epoxy (meth)acrylate resin (a) to the (meth)acrylic acid ester (b) ((a)/(b)) is from 30/70 to 70/30.

Item 2.
The thermal- and UV-curing adhesive composition according to item 1, wherein the (meth)acrylic acid ester (b) is a (meth)acrylic acid ester whose homopolymer has a Tg of 60° C. or more.

Item 3.
The thermal- and UV-curing adhesive composition according to item 1 or 2, wherein the epoxy (meth)acrylate resin (a) is a bisphenol A-type epoxy (meth)acrylate resin. Item 4.
The thermal- and UV-curing adhesive composition according to any one of items 1 to 3, wherein the heat-curing agent (c) is a polyamine.

Item 5.
The thermal- and UV-curing adhesive composition according to any one of items 1 to 4, further comprising (e) an inorganic filler.

Item 6.
The thermal- and UV-curing adhesive composition according to any one of items 1 to 5, for use in assembling a camera module.

Advantageous Effects of Invention

In the assembly of a camera module, the use of the thermal- and UV-curing adhesive composition according to the present invention to adhere a lens holder to a substrate having an image sensor fixed thereon enables sufficient curing of a site where ultraviolet rays do not reach while the adhesive composition is being cured; and reduces or prevents a change in the distance between the lens and the image sensor in the heating step.

BRIEF DESCRIPTION OF FIGURES

FIG. 1 illustrates a diagram of the procedure for a measurement test, performed in the Examples, for adhesion strength to a liquid crystal polymer (LCP).

DESCRIPTION OF EMBODIMENTS (a) Epoxy (Meth)acrylate Resin

The epoxy (meth)acrylate resin suitable for use in the present invention includes those obtained by reacting (meth)acrylic acid with an epoxy resin. This reaction can be performed in the presence of a basic catalyst in accordance with a standard method.

In particular, due to the excellent moisture resistance of the resulting cured product, an epoxy methacrylate resin is preferable.

In this specification, (meth)acrylate, (meth)acrylic, and (meth)acryloyl group respectively refer to acrylate or methacrylate; acrylic or methacrylic; and acryloyl group or methacryloyl group.

The epoxy resin usable in a starting material for producing the epoxy (meth)acrylate resin is not particularly limited. Examples thereof include bisphenol A-type epoxy resin, bisphenol F-type epoxy resin, bisphenol S-type epoxy resin, 2,2'-diallyl bisphenol A-type epoxy resin, hydrogenated bisphenol-type epoxy resin, propylene oxide addition bisphenol A-type epoxy resin, resorcinol-type epoxy resin, biphenyl-type epoxy resin, sulfide-type epoxy resin, diphenyl ether-type epoxy resin, dicyclopentadiene-type epoxy resin, naphthalene-type epoxy resin, phenol novolac-type epoxy resin, ortho-cresol novolac-type epoxy resin, dicyclopentadiene novolac-type epoxy resin, biphenyl novolac-type epoxy resin, naphthalene phenol novolac-type epoxy resin, glycidyl amine-type epoxy resin, alkyl polyol-type epoxy resin, rubber-modified-type epoxy resin, glycidyl ester compounds, and bisphenol A-type episulfide resin.

Of epoxy (meth)acrylate resins, examples of those commercially available include EA-1010, EA-1020, EA-5323, EA-5520, EA-CHD, EMA-1020 (all produced by Shin-Nakamura Chemical Co., Ltd); Ebecryl 860, Ebecryl 3200, Ebecryl 3201, Ebecryl 3412, Ebecryl 3600, Ebecryl 3700, Ebecryl 3701, Ebecryl 3702, Ebecryl 3703, Ebecryl 3800, Ebecryl 6040, and Ebecryl RDX63182 (all produced by Daicel-Cytec. Company, Ltd.); epoxy ester M-600A, epoxy ester 40EM, epoxy ester 70PA, epoxy ester 200PA, epoxy ester 80MFA, epoxy ester 3002M, epoxy ester 3002A, epoxy ester 1600A, epoxy ester 3000M, epoxy ester 3000A, epoxy ester 200EA, and epoxy ester 400EA (all produced by Kyoeisha Chemical Co., Ltd.); and Denacol Acrylate DA-141, Denacol Acrylate DA-314, and Denacol Acrylate DA-911 (all produced by Nagase ChemteX Corp.).

The epoxy (meth)acrylate resin (a) is preferably a bisphenol A-type epoxy (meth)acrylate resin.

The epoxy (meth)acrylate resin (a) comprises 20% by weight or more of a (meth)acryloyl group based on the total weight of the resin. This enables the thermal- and UV-curing adhesive composition according to the present invention to have sufficient UV curability. In this point, the epoxy (meth)acrylate resin (a) preferably comprises 30% by weight or more of the (meth)acryloyl group based on the total weight of the resin. The epoxy (meth)acrylate resin (a) typically comprises 80% by weight or less, and preferably 60% by weight or less of the (meth)acryloyl group based on the total weight of the resin, from the standpoint of a sufficiently high glass-transition temperature (Tg) after curing, and excellent adhesion at the first stage and after a reliability test.

The weight average molecular weight (Mw) of the epoxy (meth)acrylate resin (a) is not particularly limited, and is preferably 300 to 1000, more preferably 400 to 800. In this specification, the weight average molecular weight (Mw) refers to a value determined relative to polystyrene standards by gel permeation chromatography (GPC) using a solvent, such as tetrahydrofuran, as an eluent.

The thermal- and UV-curing adhesive composition according to the present invention may comprise a single type or a combination of two or more types of the epoxy (meth)acrylate resin (a).

(b) (Meth)Acrylic Acid Ester

The thermal- and UV-curing adhesive composition according to the present invention further comprises a (meth)acrylic acid ester. The (meth)acrylic acid ester may be a monofunctional (meth)acrylic acid ester, or a polyfunctional (meth)acrylic acid ester.

The homopolymer of the (meth)acrylic acid ester (b) has a Tg of preferably 60° C. or more. This enables the thermal- and UV-curing adhesive composition according to the present invention to have a sufficiently high, post-curing glass-transition temperature (Tg); and to have excellent adhesion at the first stage and after a reliability test. In this point, the homopolymer of the (meth)acrylic acid ester (b) more preferably has a Tg of 90° C. or more. The homopolymer of the (meth)acrylic acid ester (b) typically has a Tg of 250° C. or less, and preferably 200° C. or less.

Specific examples of monofunctional methacrylates include methyl methacrylate, ethyl methacrylate, n-propyl methacrylate, glycidyl methacrylate, 2-hydroxyethyl methacrylate, 2-isocyanatoethyl methacrylate, isobornyl methacrylate (e.g., "IBXA," Osaka Organic Chemical Industry Ltd.), 2-methacryloxyethyl trimethoxysilane, 2-methacryloxyethyl triethoxysilane, 3-methacryloxypropyl trimethoxysilane, 3-methacryloxypropyl methyl dimethoxy silane, 3-methacryloxypropyl triethoxysilane, 3-methacryloxymethyl diethoxysilane, 4-methacryloxybutyl trimethoxysilane, 4-methacryloxybutyl triethoxysilane, dicyclopentenyloxyethyl methacrylate (e.g., "FA-512M," produced by Hitachi Chemical Co., Ltd.), dicyclopentanyl methacrylate (e.g., "FA-513M," produced by Hitachi Chemical Co., Ltd.), pentamethyl piperidyl methacrylate (e.g., "FA-711MM," produced by Hitachi Chemical Co., Ltd.), tetramethyl piperidyl methacrylate (e.g., "FA-712HM," produced by Hitachi Chemical Co., Ltd.), methoxypolyethylene glycol methacrylate (e.g., produced by Hitachi Chemical Co., Ltd.), benzyl methacrylate (e.g., "FA-BZM," produced by Hitachi Chemical Co., Ltd.), 2-hydroxy-3-acryloyloxypropyl methacrylate (e.g., "Light Ester G-201P," produced by Kyoeisha Chemical Co., Ltd.), 2-methacryloyloxyethyl phthalate (e.g., "CB-1," produced by Shin-Nakamura Chemical Co., Ltd.), methoxypolyethylene glycol methacrylate, phenoxyethylene glycol methacrylate (e.g., "PHE-1G," produced by Shin-Nakamura Chemical Co., Ltd.), stearyl methacrylate (e.g., "S," produced by Shin-Nakamura Chemical Co., Ltd.), 2-methacryloyloxyethyl succinate (e.g., "SA," produced by Shin-Nakamura Chemical Co., Ltd.), and 3,4-epoxycyclohexylmethyl methacrylate (e.g., "Cyclomer M100," produced by Daicel Corporation).

Specific examples of difunctional methacrylates include dipropylene glycol diacrylate (e.g., "APG-100," Shin-Nakamura Chemical Co., Ltd.), tricyclodecane dimethanol diacrylate (e.g., "A-DCP," Shin-Nakamura Chemical Co., Ltd.), 1,4-butanediol dimethacrylate (e.g., "FA-124M," produced by Hitachi Chemical Co., td.), neopentyl glycol dimethacrylate (e.g., "FA-125," produced by Hitachi Chemical Co., Ltd.), polyethylene glycol #200 dimethacrylate (e.g., "FA-220M," produced by Hitachi Chemical Co., Ltd.), EO-modified bisphenol A dimethacrylate (e.g., "FA-321M," produced by Hitachi Chemical Co., Ltd.), EO-modified polypropylene glycol #700 dimethacrylate (e.g., "FA-023M," produced by Hitachi Chemical Co., Ltd.), ethylene glycol dimethacrylate (e.g., "1G," produced by Shin-Nakamura Chemical Co., Ltd.), diethylene glycol dimethacrylate (e.g., "2G," produced by Shin-Nakamura Chemical Co., Ltd.), triethylene glycol dimethacrylate (e.g., "3G," produced by Shin-Nakamura Chemical Co., Ltd.), polyethylene glycol dimethacrylate (e.g., produced by Shin-Nakamura Chemical Co., Ltd.), 2,2-bis[4-(methacryloxyethoxy)phenyl]propane (e.g., "BPE-80N," produced by Shin-Nakamura Chemical Co., Ltd.), ethoxylated bisphenol A dimethacrylate (e.g., produced by Shin-Nakamura Chemical Co., Ltd.), tricyclodecane dimethanol dimethacrylate (e.g., "DCP," produced by Shin-Nakamura Chemical Co., Ltd.), 1,10-decanediol dimethacrylate (e.g., "DOD-N," produced by Shin-Nakamura Chemical Co., Ltd.), 1,6-hexanediol dimethacrylate (e.g., "HD-N," produced by Shin-Nakamura Chemical Co., Ltd.), 1,9-nonanediol dimethacrylate (e.g., "NOD-N," produced by Shin-Nakamura Chemical Co., Ltd.), neopentylglycol dimethacrylate (e.g., "NPG," produced by Shin-Nakamura Chemical Co., Ltd.), ethoxylated polypropylene glycol dimethacrylate (e.g., produced by Shin-Nakamura Chemical Co., Ltd.), glycerol dimethacrylate (e.g., "701," produced by Shin-Nakamura Chemical Co., Ltd.), and polypropylene glycol dimethacrylate (e.g., produced by Shin-Nakamura Chemical Co., Ltd.).

Specific examples of polyfunctional (trifunctional or higher functional) methacrylates include trimethylolpropane trimethacrylate (e.g., "TMPT," produced by Shin-Nakamura Chemical Co., Ltd.).

The thermal- and UV-curing adhesive composition according to the present invention may comprise a single type or a combination of two or more types of the (meth) acrylic acid ester (b).

The weight ratio of the epoxy (meth)acrylate resin (a) to the (meth)acrylic acid ester (b) (a)/(b) is from 30/70 to 70/30. Due to the proportion of the epoxy (meth)acrylate resin (a) being 30% or more, the thermal- and UV-curing adhesive composition according to the present invention has sufficient adhesion at the first stage and after a reliability test. Due to the proportion of the epoxy (meth)acrylate resin (a) being 70% or less, the thermal- and UV-curing adhesive composition according to the present invention has a viscosity within a suitable range, which makes the handling thereof easier. For these reasons, the weight ratio of the epoxy (meth)acrylate resin (a) to the (meth)acrylic acid ester (b) (a)/(b) is preferably from 40/60 to 60/40.

The total content of the epoxy (meth)acrylate resin (a) and the (meth)acrylic acid ester (b) is preferably 30 to 70% by weight, and more preferably 40 to 60% by weight, based on the total weight of the thermal- and UV-curing adhesive composition.

(c) Heat-Curing Agent

The heat-curing agent (c) is preferably a polyamine-based heat-curing agent. The heat-curing agent (c) is more preferably a polyamine-based heat-curing agent containing primary and secondary amines.

The heat-curing agent (c) preferably has a melting point of 50° C. or more, and more preferably 60° C. or more, from the standpoint of prolonged product lifetime. The heat-curing agent (c) has a melting point of 80° C. or less, and more preferably 70° C. or less, for sufficient thermosetting properties at a normal thermosetting temperature (typically 80° C.).

Of polyamine-based heat-curing agents, examples of those commercially available include Fujicure FXR-1020, FXR-1030, FXR-1050, and FXR-1080 (produced by Fuji Kasei Kogyo K.K.); and ADK Hardener EH-4357S, EH-5057P, and EH-5057PK (produced by ADEKA Corporation).

The thermal- and UV-curing adhesive composition according to the present invention may comprise a single type or a combination of two or more types of the heat-curing agent (c).

The content of the heat-curing agent (c) is preferably 10 to 40% by weight, and more preferably 20 to 30% by weight, based on the total weight of the thermal- and UV-curing adhesive composition.

(d) Photopolymerization Initiator

The photopolymerization initiator (d) is not particularly limited, and those typically used in the art can be used.

Of photopolymerization initiators (d), examples of those commercially available include IRGACURE 651 (2,2-dimethoxy-1,2-diphenylethan-1-one), IRGACURE 184 (1-hydroxy-cyclohexyl-phenyl-ketone), DAROCUR 1173 (2-hydroxy-2-methyl-1-phenyl-propan-1-one), IRGACURE 2959 (1-[4-(2-hydroxyethoxy)-phenyl]-2-hydroxy-2-methyl-1-propan-1-one), IRGACURE 127 (2-hydroxy-1-{4-[4-(2-hydroxy-2-methyl-propionyl)-benzyl]phenyl]-2-methyl-propan-1-one}, IRGACURE 907 (2-methyl-1-(4-methylthiophenyl)-2-morpholinopropan-1-one), IRGACURE 369 (2-benzyl-2-dimethylamino-1-(4-morpholinophenyl)-butanone-1), IRGACURE 379 (2-(dimethylamino)-2-[(4-methylphenyl)methyl]-1-[4-(4-morpholinyl) phenyl]-1-butanone), DAROCUR TPO (2,4,6-trimethylbenzoyl-diphenyl-phosphine oxide), IRGACURE 819 (bis(2,4, 6-trimethyl benzoyl)-phenyl phosphine oxide), IRGACURE 784 (bis(η5-2,4-cyclopentadien-1-yl)-bis(2,6-difluoro-3-(1H-pyrrol-1-yl)-phenyl) titanium), IRGACURE OXE 01 (1,2-octanedione, 1-[4-(phenylthio)-,2-(O-benzoyl oxime)]), IRGACURE OXE 02 (ethanone,1-[9-ethyl-6-(2-methylbenzoyl)-9H-carbazol-3-yl]-,1-(0-acetyloxime)), IRGACURE 754 (a mixture of oxy-phenyl acetic acid 2-[2-oxo-2-phenyl acetoxyethoxy]ethyl ester and oxy-phenyl acetic acid 2-(2-hydroxyethoxy)ethyl ester), Lucirin TPO, LR8893, LR8970 (all above produced by BASF Japan Ltd.), DETX-S(2,4-diethyl thioxanthone) (produced by Nippon Kayaku Co., Ltd.), and Ebecryl P36 (produced by UCB).

The thermal- and UV-curing adhesive composition according to the present invention may comprise a single type or a combination of two or more types of the photopolymerization initiator (d).

The content of the photopolymerization initiator (d) is preferably 0.5 to 5% by weight, and more preferably 1 to 2% by weight, based on the total weight of the thermal- and UV-curing adhesive composition.

(e) Inorganic Filler

The thermal- and UV-curing adhesive composition according to the present invention may further comprise an inorganic filler (e). By adding the inorganic filler (e), the coefficient of thermal expansion of the thermal- and UV-curing adhesive composition can be controlled. The inorganic filler (e) includes silica filler, such as colloidal silica, hydrophobic silica, fine silica, and nanosilica; acrylic beads; glass beads; urethane beads; bentonite; acetylene black; and Ketjenblack.

The mean particle size of the inorganic filler (e) (if the filler is not in the form of particles, the largest mean size) is not particularly limited, and is preferably 0.01 µm or more, from the standpoint of excellent handling of the thermal- and UV-curing adhesive composition. The mean particle size of the inorganic filler (e) (if the filler is not in the form of particles, the largest mean size) is preferably 50 µm or less, from the standpoint of homogeneous dispersion of the filler in the thermal- and UV-curing adhesive composition. In the present invention, the mean particle size of the inorganic filler refers to a value as measured with a dynamic light scattering Nanotrac particle size analyzer.

Those commercially available for the inorganic filler (e) include synthetic high-purity spherical silica SO-E5 or SO-E2 (produced by Admatechs Company Limited, mean particle size of SO-E5: 2 μm, mean particle size of SO-E2: 0.6 μm), silica FB7SDX (produced by Tatsumori Ltd., mean particle size: 10 μm), and silica TS-10-034P (produced by Micron, mean particle size: 20 μm).

The thermal- and UV-curing adhesive composition according to the present invention may comprise a single type or a combination of two or more types of the inorganic filler (e).

(f) Other Components

The thermal- and UV-curing adhesive composition according to the present invention may further comprise other components. The other components include, as adhesive adjuvants, various coupling agents, such as silane and titanate; and rheology adjusters, such as fumed silica.

Use

The thermal- and UV-curing adhesive composition according to the present invention is preferably used in assembling a camera module. More specifically, the thermal- and UV-curing adhesive composition according to the present invention is preferably used in assembling a camera module to adhere a lens holder to a substrate having an image sensor fixed thereon. The camera module is not particularly limited, and is, for example, a compact camera module used for a smartphone or other such device.

EXAMPLES

Adhesive compositions of Comparative Examples 1 to 3 and Examples 1 to 3 were prepared by mixing each component at a composition ratio shown in Table 1. More specifically, epoxy acrylate, in which a heat-curing agent in the form of a powder, an inorganic filler, and a photopolymerization initiator were dissolved, and an acrylate ester resin were well dispersed in a three-roll mill. The obtained mixture and other additives, etc., were mixed in a planetary mixer, and vacuum degassing was further performed to obtain adhesive compositions.

Each of the physical properties was evaluated as follows. Table 1 shows the evaluation results.

Curing Tg

The adhesive composition was applied to a release film to a thickness of 300 μm, followed by irradiation with a 365-nm LED (2.5 J/cm$^2$). Thereafter, curing was performed at 80° C. for 60 minutes in a hot-air circulation oven. The obtained cured product was subjected to thermal analysis using a TMA (thermomechanical analyzer), and the Tg thereof was measured.

Adhesive Strength to LCP (Liquid Crystal Polymer)

FIG. 1 shows the process. The following describes the details. The adhesive composition in an amount (weight) of about 3.5 mg was dispensed on a ceramic substrate (15 mm×15 mm) to form a hollow square (5 mm×5 mm). Thereafter, an LCP chip (7 mm×7 mm) was mounted thereon, and the thickness of the adhesive was adjusted to be 100 μm. Irradiation with a 365-nm LED was performed from four circumferential directions (500 mW/cm$^2$×2 seconds) for temporary curing. Thereafter, the samples were cured by heating at 80° C. for 60 minutes in a hot-air circulation oven, and subjected to measurement at a shear speed of 200 μm/s at a shear height of 120 μm using a bond tester (4000 Optima, produced by Dage).

A reliability test was conducted under the conditions of 85° C. and 85% RH for 250 hours.

The adhesive compositions of Examples 1 to 3 were immediately cured by UV irradiation; the curing Tg ultimately became 85° C. or higher when further cured by heating. The adhesion was excellent at the first stage and after the reliability test. This is presumably because a primary and secondary amine-containing polyamine was present as a heat-curing agent, and the addition reaction proceeded by heating.

In contrast, in Comparative Example 1, in which imidazole was present as a heat-curing agent, the acrylic resin was not cured by heating, and the adhesion was insufficient at the first stage and after the reliability test.

Next, in Comparative Example 2, the content of (meth)acryloyl group in the entire resin was low (10 wt %) in the epoxy (meth)acrylate resin (a), and the curing Tg was low.

Finally, in Comparative Example 3, the weight ratio of the epoxy (meth)acrylate resin (a) to the (meth)acrylic acid ester (b) ((a)/(b)) was 8/92. Since the content of the epoxy (meth)acrylate resin (a) was overly low, the adhesion was insufficient at the first stage and after the reliability test.

TABLE 1

| Type | Product Name, Manufacturer | Physical Properties | Comp. Ex. 1 | Comp. Ex. 2 | Comp. Ex. 3 | Ex. 1 | Ex. 2 | Ex. 3 |
|---|---|---|---|---|---|---|---|---|
| (a) Epoxy (meth)acrylate resin | Bisphenol A-type epoxy acrylate resin (EA-1010LC (50 wt % of acryloyl group), Shin-Nakamura Chemical Co., Ltd.) | Acryloyl group content: 50 wt % | 25 | — | 5 | 31.5 | 20 | 25 |
| | | Acryloyl group content: 10 wt % | — | 25 | — | — | — | — |
| (b) (Meth)acrylic acid ester | Dipropylene glycol diacrylate (APG-100, Shin-Nakamura Chemical Co., Ltd.) | Tg of homopolymer: 110° C. | 20 | 20 | — | 22 | — | — |
| | Isobornyl acrylate (BXA, Osaka Organic Chemical Industry Ltd.) | Tg of homopolymer: 95° C. | 13.5 | 10 | 18 | — | 10 | — |
| | Tricyclodecane dimethanol diacrylate (A-DCP, Shin-Nakamura Chemical Co., Ltd.) | Tg of homopolymer: 156° C. | — | — | 37 | — | 18 | 25 |
| (c) Heat-curing agent | Fujicure FXR-1020, T&K TOKA Co., Ltd. *primary and secondary amine-containing polyamine | Melting point: 65° C. | — | 20 | 25 | 20 | — | — |
| | EH-5057PK, Adeka Corporation *primary and secondary amine-containing polyamine | Melting point: 68° C. | — | — | — | — | 25 | 25 |
| | 2-Ethyl-4-methylimidazole (2E4MZ, Shikoku Chemicals Corporation) | Melting point: 50° C. | 15 | — | — | — | — | — |

TABLE 1-continued

| Type | Product Name, Manufacturer | Physical Properties | Comp. Ex. 1 | Comp. Ex. 2 | Comp. Ex. 3 | Ex. 1 | Ex. 2 | Ex. 3 |
|---|---|---|---|---|---|---|---|---|
| (d) Photopolymerization initiator | Irgacure 184, BASF | | 1.5 | 1.5 | 1.5 | 1.5 | 1.5 | 1.5 |
| (e) Inorganic filler | Synthetic spherical silica (D50 2 μm) (SO-E5, Admatechs) | | 25 | 23.5 | 13.5 | 25 | 23 | 23.5 |
| Ratio of epoxy (meth)acrylate resin (a) to (meth)acrylic acid ester (b) ((a)/(b)) | | | 57/43 | 55/45 | 8/92 | 59/41 | 42/58 | 50/50 |
| Curing Tg | | | 92 | 63 | 113 | 102 | 107 | 113 |
| Adhesive strength to LCP after curing (MPa) | | | 6.7 | 11.6 | 3.8 | 13.1 | 16.1 | 17.3 |
| Decrease in adhesive strength (%) after the reliability test (85° C./85% RH, 250 hours) | | | 72 | 43 | 86 | 22 | 18 | 26 |

What is claimed is:

1. A thermal- and UV-curing adhesive composition, comprising:
   (a) an epoxy (meth)acrylate resin;
   (b) a (meth)acrylic acid ester whose homopolymer has a Tg of 60° C. or more;
   (c) a heat-curing agent; and
   (d) a photopolymerization initiator,
   wherein the epoxy (meth)acrylate resin (a) comprises 20% by weight or more of a (meth)acryloyl group based on the total weight of the resin, and
   the weight ratio of the epoxy (meth)acrylate resin (a) to the (meth)acrylic acid ester (b) ((a)/(b)) is from 30/70 to 70/30.

2. The thermal- and UV-curing adhesive composition according to claim 1, wherein the (meth)acrylic acid ester (b) is a (meth)acrylic acid ester whose homopolymer has a Tg of 60° C. to 250° C.

3. The thermal- and UV-curing adhesive composition according to claim 1, wherein the epoxy (meth)acrylate resin (a) comprises 30% by weight to 80% by weight of a (meth)acryloyl group based on the total weight of the resin.

4. The thermal- and UV-curing adhesive composition according to claim 1, wherein the heat-curing agent (c) is a polyamine, and present in an amount of 10% to 40% by weight based on the total composition.

5. The thermal- and UV-curing adhesive composition according to claim 1, further comprising (e) an inorganic filler having a particle size in the range of 0.01 μm to 50 μm.

6. A camera module assembled with the thermal- and UV-curing adhesive composition according to claim 1.

7. A thermal- and UV-curing adhesive composition, comprising:
   (a) an epoxy (meth)acrylate resin comprising a bisphenol A-type epoxy (meth)acrylate resin;
   (b) a (meth)acrylic acid ester whose homopolymer has a Tg of 60° C. or more;
   (c) a heat-curing agent comprising a polyamine;
   (d) a photopolymerization initiator; and
   (e) an inorganic filler,
   wherein the epoxy (meth)acrylate resin (a) comprises 20% by weight or more of a (meth)acryloyl group based on the total weight of the resin, and
   the weight ratio of the epoxy (meth)acrylate resin (a) to the (meth)acrylic acid ester (b) ((a)/(b)) is from 30/70 to 70/30.

8. A thermal- and UV-curing adhesive composition, comprising:
   (a) an epoxy (meth)acrylate resin comprising a bisphenol A-type epoxy (meth)acrylate resin;
   (b) a (meth)acrylic acid ester whose homopolymer has a Tg of 60° C. or more present in an amount of at least 10% by weight based on the total composition;
   (c) a heat-curing agent comprising a polyamine present in an amount of 10 to 40% by weight based on the total composition;
   (d) a photopolymerization initiator present in an amount of 0.5 to 5% by weight based on the total composition; and
   (e) an inorganic filler present in an amount of at least 23% by weight based on the total composition,
   wherein the epoxy (meth)acrylate resin (a) comprises 20% by weight or more of a (meth)acryloyl group based on the total weight of the resin, and
   the weight ratio of the epoxy (meth)acrylate resin (a) to the (meth)acrylic acid ester (b) ((a)/(b)) is from 30/70 to 70/30.

9. A camera module comprising:
   (a) a lens;
   (b) a cylindrical lens holder for holding the lens;
   (c) a substrate having an image sensor disposed thereon, wherein the image sensor converts light collected by the lens into an electrical signal; and
   (d) the thermal- and UV-curing adhesive composition according to claim 1,
   wherein the thermal- and UV-curing adhesive composition is disposed between the cylindrical lens holder and the substrate having an image sensor disposed thereon and when cured adheres the cylindrical lens holder to the substrate having an image sensor disposed thereon.

10. The thermal- and UV-curing adhesive composition according to claim 1, wherein once cured the composition demonstrates an adhesive strength of about at least 13.1 MPa.

11. The thermal- and UV-curing adhesive composition according to claim 1, wherein once cured and exposed to a temperature of 85° C. and relative humidity of 85% for a period of time of 250 hours the composition demonstrates a percent decrease of adhesive strength of about 26 or less.

12. The camera module of claim 6, comprising:
   (a) a lens;
   (b) a cylindrical lens holder for holding the lens;
   (c) a substrate having an image sensor disposed thereon, wherein the image sensor converts light collected by the lens into an electrical signal; and
   (d) the thermal- and UV-curing adhesive composition, wherein the thermal- and UV-curing adhesive composition is disposed between the cylindrical lens holder and the substrate having an image sensor disposed thereon and when cured adheres the cylindrical lens holder to the substrate having an image sensor disposed thereon.

* * * * *